United States Patent
Saishoji et al.

[11] Patent Number: 6,056,931
[45] Date of Patent: May 2, 2000

[54] SILICON WAFER FOR HYDROGEN HEAT TREATMENT AND METHOD FOR MANUFACTURING THE SAME

[75] Inventors: Toshiaki Saishoji; Kozo Nakamura; Junsuke Tomioka, all of Kanagawa, Japan

[73] Assignee: Komatsu Electronic Metal Co., Ltd., Kanagawa, Japan

[21] Appl. No.: 09/014,048

[22] Filed: Jan. 27, 1998

[30] Foreign Application Priority Data

Jan. 27, 1997 [JP] Japan ................................ 9-027213

[51] Int. Cl.$^7$ .................................................. C01B 33/26

[52] U.S. Cl. ........................................ 423/328.1; 117/13

[58] Field of Search ................................. 423/328.1

[56] References Cited

U.S. PATENT DOCUMENTS 5,169,791  12/1992  Muenzer ....................................... 438/1
5,470,799  11/1995  Itoh et al. .................................... 438/1

Primary Examiner—Felisa Hiteshew
Attorney, Agent, or Firm—Sughrue, Mion, Zinn Macpeak & Seas, PLLC

[57] ABSTRACT

In growing silicon single crystals by the CZ method, the cooling rate in the 1150–1080° C. temperature zone (defect-forming temperature range) where the grown-in defects are formed is set at more than 2.0° C./min to manufacture single crystals having an as-grown LSTD density of larger than $3.0 \times 10^6/cm^3$ or a FPD density of larger than $6.0 \times 10^5/cm^3$. As this single crystal has a small defect size, thus the dissolution rate of the defects increases by the heat treatment in a non-oxidizing atmosphere containing a hydrogen gas, so the effect of the hydrogen heat treatment can extend to the depth more than 3 $\mu$m from the wafer surface.

3 Claims, 1 Drawing Sheet

SILICON WAFER FOR HYDROGEN HEAT TREATMENT AND METHOD FOR MANUFACTURING THE SAME

BACKGROUND OF THE INVENTION

1. Field of the Invention

The present invention relates to a silicon wafer for hydrogen heat treatment and the method for manufacturing the same.

2. Description of the Related Art

As the substrates for forming semiconductor elements, high-purity silicon single crystals are mainly utilized. The silicon single crystals are usually manufactured by the CZ method. In the CZ method, a lump shaped polysilicon is fed into a crucible disposed in a single crystal-manufacturing apparatus, and then the polysilicon is heated and melted by heaters surrounding the crucible to form a melt. Thereafter, a seed crystal mounted on a seed chuck is dipped into the melt. The seed chuck and the crucible are then rotated in the same or reverse direction while pulling the seed chuck to grow a silicon single crystal (hereinafter referred as CZ-Si single crystal) having a predetermined diameter and length.

In recent years, with the scaling-down and higher integration of semiconductor devices, the gate oxide film insulation characteristic has particularly received attention. As a means for reducing the defects entrapped in the oxide film in the gate oxide film-forming process, according to JP-A3-80338(JP-A: Unexamined Japanese Patent Publication), it has been proposed that immediately before the formation of a thermal oxide film on the surface of a silicon wafer, the silicon wafer is subjected to a heat treatment at a temperature above 1100° C. in an non-oxidizing atmosphere containing a hydrogen gas. By means of the hydrogen heat treatment, the natural oxide film on the surface of the silicon wafer is removed and hydrogen is bonded to an unsaturated bond of the surface of the silicon wafer.

Moreover, subjecting the silicon wafer to the hydrogen heat treatment eliminates the octahedral void like defects near the surface of the wafer, which are detected as the grown-in defects formed in the crystals during the growing of the CZ-Si single crystals, such as LSTD (Laser scattering Tomography Defects), FPD (Flow Pattern Defects) and COP (Crystal Originated Particles). And thus the thermal oxide film formed thereafter demonstrates good oxide film insulation characteristics.

Table 1 summarizes the results of the measured oxide film insulation of 14 mirror-polished wafers. The 14 mirror-polished wafers are respectively sliced from 14 CZ-Si single crystal ingots which are respectively grown by 14 different growing conditions using a boron doped, p-type, <100>, 150 mm diameter CZ-Si single crystal. The above 14 conditions involve different furnace hot zones and different pulling speed during the pulling of the single crystals. In the measurement of the oxide film insulation, a MOS capacitor is formed on the wafer, the electric field is then raised to 0.5 MV/cm step by step to cause the gate electrode to be in an electric charge accumulation state with respect to the substrate. Thereafter, the electric field when the current flowing in the MOS capacitor reaches 10 μA, is considered to be the insulation breakdown electric field, and if the value is larger than 8 MV/cm, the element is regarded as non-defective article. Moreover, in Table 1, the oxide film insulation yields are set forth with respect to: the state after the mirror-polishing process of the silicon wafer, i.e., in an as-grown state, the state after subjecting to heat treatment in a 100% hydrogen atmosphere at 1200° C. for 1 hour, and the state wherein the surface of the hydrogen heat treated silicon wafer is polished to a depth of 3 μm.

TABLE 1

| | | Oxide Film Insulation Yield (%) | |
|---|---|---|---|
| No. | As-grown | After hydrogen heat treatment | After polishing 3 μm |
| 1 | 39.2 | 100.0 | 43.1 |
| 2 | 34.5 | 100.0 | 45.3 |
| 3 | 43.0 | 99.0 | 43.7 |
| 4 | 30.4 | 100.0 | 36.2 |
| 5 | 52.1 | 98.2 | 57.1 |
| 6 | 55.3 | 96.0 | 63.6 |
| 7 | 34.2 | 99.8 | 44.8 |
| 8 | 27.6 | 100.0 | 99.2 |
| 9 | 36.4 | 97.2 | 97.8 |
| 10 | 24.8 | 100.0 | 99.5 |
| 11 | 19.0 | 100.0 | 100.0 |
| 12 | 20.4 | 99.0 | 95.2 |
| 13 | 23.7 | 98.5 | 96.0 |
| 14 | 22.5 | 100.0 | 98.8 |

As shown in Table 1, in the as-grown state, the oxide film insulation yield is at most 20–55 percent, however, when subjected to the hydrogen heat treatment as proposed in JP-A 3-80338, the oxide film insulation yield is increased to close to 100 percent, regardless of the growing conditions of the CZ-Si single crystals.

However, in order to ascertain to how deep the effect of the hydrogen heat treatment is from the surface of the wafer, the hydrogen heat-treated surface is polished to remove 3 μm. As a result, it can be classified into the group in which the oxide film insulation characteristic is significantly reduced and returned to the as-grown state, as shown in Nos. 1–7 and the group in which the effect of the hydrogen heat treatment is maintained, as shown in Nos. 8–14. Namely, the effect of the hydrogen heat treatment is limited to the proximity of the surface of the wafer, and can extend to a depth of more than 3 μm from the wafer surface.

SUMMARY OF THE INVENTION

In consideration of the integrity of the wafer surface layer, which becomes more important with the high integration of the semiconductor devices, it is very possible that the hydrogen heat treatment will adversely influence the yield of the semiconductor devices because, for wafers Nos. 1–7, the effect of the hydrogen heat treatment is limited to the proximity of the wafer surface. In view of the above problems of the prior art, the object of the invention is to provide a silicon wafer for hydrogen heat treatment and a method of manufacturing the same, capable of extending the insulation characteristic to a depth larger than 3 μm at least from the wafer surface when increasing the oxide film insulation of a silicon wafer by the hydrogen heat treatment.

In order to attain the object of the invention, the silicon wafer for hydrogen heat treatment according to the invention is subject to hydrogen heat treatment in a non-oxidizing atmosphere containing hydrogen gas. The resultant LSTD density is larger than $3.0 \times 10^6/\text{cm}^3$ or the FPD density is larger than $6.0 \times 10^5/\text{cm}^3$.

Moreover, in the method for manufacturing the silicon wafer for hydrogen heat treatment, characterized by growing the silicon single crystal by the CZ method, the cooling rate at the temperature range of 1150° C.–1080° C. is larger than 2.0° C./min.

A first aspect of the silicon wafer for hydrogen heat treatment, to be heat treated in a non-oxidizing atmosphere containing hydrogen gas, is a silicon wafer of the present invention, which has at least one of LSTD density larger than $3.0 \times 10^6/cm^3$ and the FPD density larger than $6 \times 10^5/cm^3$ at as-grown state.

A second aspect of the silicon wafer for hydrogen heal: treatment is a silicon wafer according to the first aspect, wherein the silicon wafer has so small size of defects as to be eliminated in the depth more than 3 μm from the surface by the hydrogen heat treatment.

A third aspect of the method is a method of manufacturing a silicon wafer for hydrogen heat treatment according to the first aspect, which comprises the steps of:

growing a single crystal silicon by the CZ method; and slicing the single crystal silicon into silicon wafers, wherein the step of growing comprises the step of pulling the single crystal silicon while cooling and the cooling rate at the temperature range of 1150° C.–1080° C. is larger than 2.0° C./min in the step of growing.

A fourth aspect of the method of manufacturing a silicon wafer for hydrogen heat treatment is a method of the present invention, which comprises the steps of:

growing a single crystal silicon by the CZ method; and slicing the single crystal silicon into silicon wafers, wherein the step of growing comprises the step of pulling the single crystal silicon while cooling and the cooling rate at the temperature range of 1150° C.–1080° C. is larger than 2.0° C./min in the step of growing.

BRIEF DESCRIPTION OF THE DRAWING

The preferred embodiment and examples of the invention is hereinafter described with reference to the accompanying drawing, FIG. 1, which is a diagram showing the relationship between the cooling rate in the defect-forming temperature zone and the defect density and defect size.

DETAILED DESCRIPTION OF THE PREFERRED EMBODIMENT

Figure 1:
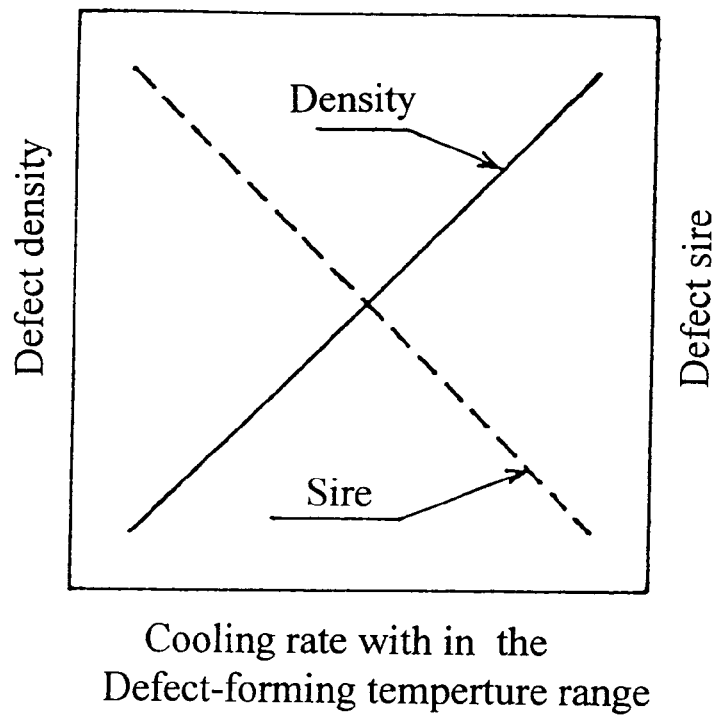

It is thought that the grown-in defects are formed while the silicon single crystals solidified in the process for growing the CZ-Si single crystals from the melt pass through the temperature range of 1150° C.1080° C., i.e., the defect-forming temperature zone. The grown-in defect density and the defect size are shown in FIG. 1. The faster the cooling rate at the defect-forming temperature zone, the higher the defect density and the smaller the defect size, in an inverse relationship. According to the invention, a silicon wafer having an as-grown LSTD density of larger than $3.0 \times 10^6/cm^3$, and a FPD density of larger than $6.0 \times 10^5/cm^3$ is used, and thus the defect size is small. The mechanism by which the defects disappear when a hydrogen heat treatment is performed is not clear. However, it is thought that when the defect size is small, the disappearance rate of the defects increases, and thus the hydrogen heat treatment has effects not only on the wafer surface, but also in the depth direction. In contrast, when the defect is large, it is presumed that only the defects at the surface layer disappear, and thus the defects at the location deeper than the surface layer do not disappear.

According to the FIG. 1, it is known that accelerating the cooling rate while passing through the defect-forming temperature zone yields a CZ-Si single crystal which is made into the silicon wafer for the hydrogen treatment, having a high grown-in defect density, i.e., a small defect size. Accordingly, in the manufacturing method of a silicon wafer for hydrogen treatment, the cooling rate in the temperature range of 1150° C.–1080° C. is larger than 2.0° C./min, and thus it is possible to obtain a CZ-Si single crystal having a small grown-in defect size.

Next, the preferred embodiment of the silicon wafer for hydrogen heat treatment and the manufacturing method is described.

First, with respect to the 14 silicon wafers for hydrogen heat treatment summarized in Table 1, the density of the grown-in defects (LSTD and FPD) which exists in proximity to the surface layer of a wafer and is strongly associated with the oxide film insulation characteristic, the growing conditions of the CZ-Si single crystals that control the defect density, i.e., the cooling rate passing through the 1150° C.–1080° C. temperature zone while growing the CZ-Si single crystal (the product of the single crystal pulling speed, V mm/min multiplied by the temperature gradient in the defect-forming zone, G°C./mm), were investigated. The results are shown in Table 2 below. Moreover, the oxide film insulation yield after 3 μm polishing set forth in Table 2 are numerals from Table 1.

TABLE 2

|  |  | Oxide film insulation yield after polishing 3 μm (%) | LSTD density (× 10^6/ cm^3) | FPD density (× 10^5/ cm^3) | Cooling rate V × G (° C./min) |
|---|---|---|---|---|---|
| Prior Art | 1 | 43.1 | 2.1 | 4.7 | 1.95 |
|  | 2 | 45.3 | 1.8 | 3.2 | 1.52 |
|  | 3 | 43.7 | 1.5 | 3.5 | 1.41 |
|  | 4 | 36.2 | 2.5 | 5.7 | 1.84 |
|  | 5 | 57.1 | 1.0 | 2.8 | 1.09 |
|  | 6 | 63.6 | 0.7 | 1.9 | 0.85 |
|  | 7 | 44.8 | 2.6 | 5.8 | 1.93 |
| This Invention | 8 | 99.2 | 3.4 | 6.5 | 2.32 |
|  | 9 | 97.8 | 3.6 | 6.2 | 2.14 |
|  | 10 | 99.5 | 3.0 | 6.3 | 2.80 |
|  | 11 | 100.0 | 5.1 | 8.2 | 3.80 |
|  | 12 | 95.2 | 3.1 | 6.0 | 2.06 |
|  | 13 | 96.0 | 3.4 | 6.1 | 2.45 |
|  | 14 | 98.8 | 4.2 | 7.7 | 3.18 |

Note
V: Crystal Pulling Speed (mm/min)
G: Temperature Gradient in 1150~1080° C. (° C./mm)

As can be seen from Table 2, with respect to the silicon wafers of Nos. 8–14 which have a LSTD density of larger than $3.0 \times 10^6/cm^3$ and a FPD density of larger than $6.0 \times 10^5/cm^3$ before hydrogen heat treatment, the effect of the hydrogen heat treatment after a 3 μm surface-polishing is maintained. With respect to the silicon wafers of Nos. 8–14, in the growing of the Cz-Si single crystals, the cooling rate passing through the defect-forming temperature range is larger than 2.0° C./min, faster than the cooling rate of the silicon wafers of Nos. 1–7. That is, it is presumed from FIG. 1 that the defect size in the crystals of the silicon wafers of Nos. 8–14 is smaller than that of the crystals of the silicon wafers of Nos. 1–7, and thus the dissolution rate of the defects increases due to the hydrogen heat treatment so that difference of the effect appears in the depth direction of the wafer.

It is found from the above results that the quality of the oxide film insulation characteristic of the hydrogen heat-treated surface of the wafer, which has been polished to a depth of 3 μm, is determined by the grown-in defect density and the cooling rate between 1150° C. and 1080° C. in the process of growing the crystal. Accordingly, it is understood that in order to obtain a CZ-Si single crystal having a high grown-in defect density, in the growing of single crystals, the cooling rate must be larger than 2.0° C./min.

According to the manufacturing method of the invention in which the cooling rate in the growing of the CZ-Si single crystals is larger than 2.0° C./min, by using a silicon wafer which is manufactured for hydrogen heat treatment and has a LSTD density of $3.6\times10^6/cm^3$ and a FPD density of $6.0\times10^5/cm^3$, the effect of the hydrogen heat treatment in the depth direction from the wafer surface becomes larger, thus ensuring a free-defect layer which is indispensable for the fabrication of high integrated semiconductor devices without improving the condition of the hydrogen heat treatment.

The manufacturing method of silicon wafers for hydrogen heat treatment can also be applicable to silicon wafers to be heat-treated in an inert gas atmosphere, besides hydrogen, for example argon gas or nitrogen gas.

As described above, in accordance with the invention, when a wafer having a grown-in defect density larger than a predetermined value is used as the silicon wafer for hydrogen heat treatment, before forming the gate oxide film (which is important to semiconductor devices), the effect of the performed hydrogen heat treatment extends not only to the surface of the silicon wafer but also to a depth of 3 μm from the wafer surface. In this way, it is possible to ensure a free-defect layer, which is indispensable for the fabrication of the high-integrated semiconductor devices. Moreover, as a manufacturing method for the CZ-Si single crystal which is the substrate of the wafer, by setting the cooling rate passing through the grown-in defect forming temperature zone to a predetermined value, it is easy to obtain a single crystal suitable for use as a silicon wafer for hydrogen heat treatment, and to increase the yield of CZ-Si single crystals.

What is claimed is:

1. A silicon wafer for hydrogen heat treatment, to be heat treated in a non-oxidizing atmosphere containing a hydrogen gas, the silicon wafer has at least one of LSTD density larger than $3.0\times10^6/cm^3$ and the FPD density larger than $6.0\times10^5/cm^3$ at as-grown state.

2. The silicon wafer for hydrogen heat treatment as claimed in claim 1,
    wherein the silicon wafer has so small size of defects as to be eliminated in the depth more than 3 μm from the surface by the hydrogen heat treatment.

3. The method of manufacturing a silicon wafer for hydrogen heat treatment as claimed in claim 1, comprising the steps of:
    growing a single crystal silicon by the CZ method; and
    slicing the single crystal silicon into silicon wafers,
    wherein the step of growing comprises the step of pulling the single crystal silicon while cooling and the cooling rate at the temperature range of 1150° C.–1080° C. is larger than 2.0° C./min in the step of growing.

* * * * *